(12) United States Patent
Majcherczak et al.

(10) Patent No.: US 6,636,089 B2
(45) Date of Patent: Oct. 21, 2003

(54) POWER SUPPLY DETECTION DEVICE

(75) Inventors: Sylvain Majcherczak, St. Martin d'Heres (FR); Guy Mabboux, Chapareillan (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/113,859

(22) Filed: Apr. 1, 2002

(65) Prior Publication Data

US 2002/0163364 A1 Nov. 7, 2002

(30) Foreign Application Priority Data

Apr. 2, 2001 (FR) .............................................. 01 04463

(51) Int. Cl.$^7$ ............................................. H03K 17/22
(52) U.S. Cl. ......................... 327/143; 327/198; 327/81
(58) Field of Search ................................ 327/143, 198, 327/530, 544, 80, 81, 77, 33; 326/80, 81

(56) References Cited

U.S. PATENT DOCUMENTS

| | | | |
|---|---|---|---|
| 4,682,051 A | 7/1987 | Arakawa | 307/359 |
| 4,873,458 A | 10/1989 | Yoshida | 307/362 |
| 5,097,146 A | 3/1992 | Kowalski et al. | 307/350 |
| 5,313,430 A * | 5/1994 | Rawlins et al. | 365/229 |
| 5,731,720 A * | 3/1998 | Suzuki et al. | 327/80 |
| 6,104,220 A | 8/2000 | Ciccone | 327/143 |
| 6,169,426 B1 | 1/2001 | Lee et al. | 327/77 |
| 6,310,497 B1 * | 10/2001 | Strauss | 327/143 |
| 6,342,802 B1 * | 1/2002 | Forehand | 327/198 |
| 6,367,024 B1 * | 4/2002 | Ezell | 327/143 |

FOREIGN PATENT DOCUMENTS

DE 4200623 9/1992 ........... G01R/17/00

* cited by examiner

Primary Examiner—Toan Tran
(74) Attorney, Agent, or Firm—Lisa K. Jorgenson; Allen, Dyer, Doppelt, Milbrath & Gilchrist, P.A.

(57) ABSTRACT

In an integrated circuit, a detection device detects a drop in the supply voltage of the core of the integrated circuit or an excessively slow build-up of this voltage with respect to a supply voltage of the input/output interface circuits of the integrated circuit. Outputs of the interface circuits are set to a high impedance state by the detection device to minimize their power consumption.

20 Claims, 6 Drawing Sheets

POWER SUPPLY DETECTION DEVICE

FIELD OF THE INVENTION

The present invention relates to power supplies, and more particularly, to a power supply detection device for an integrated circuit using at least two power supply voltages. One power supply voltage is for a core of the integrated circuit, which is defined by the manufacturing technology of the circuit. The other power supply voltage is a voltage greater than the power supply voltage for the core, and is applied to external interfaces of the integrated circuit and to input/output interface circuits within the integrated circuit.

BACKGROUND OF THE INVENTION

Integrated circuits with a distinct core supply voltage and a distinct interface supply voltage have appeared with new manufacturing technologies used to make low-voltage integrated circuits. For these circuits, the core voltage has fallen to 1.8 volts in certain technologies (0.18 $\mu$) and 1.2 volts in other technologies (0.12 $\mu$).

Since these circuits have to be used in systems whose power supply voltage is higher, the input/output interface circuits include a level-matching stage. For the transmission of output signals, this level matching is carried out by a level translator type selector switch, which receives the interface power supply voltage. This switch matches the levels of the logic signals received from the core of the integrated circuit, and those received from the external circuits with which it exchanges data.

Internal control signals are commonly used to control the interface circuits. Some of these signals also go through the level translators. As for the signals received at input from the integrated circuit, they enter with an interface voltage level. Their level must therefore be lowered.

It has been observed that these input-output interface circuits are the site of malfunctions related either to the disappearance of the core supply voltage, or to the fact that the build-up of this voltage is slower than that of the interface supply voltage. In both situations, the level translators of the interface circuits do not work properly, and malfunctions are seen in the integrated circuit.

It may be recalled that level translators commonly have a structure with two arms, each comprising a control transistor and a load transistor. One of the control transistors is controlled by an input logic signal DATA, and the other is controlled by the inverse logic signal /DATA.

When the core supply voltage disappears, the two logic voltages DATA and /DATA fall to zero. The two control transistors are then off. The voltage at an output of the translator becomes uncontrollable and dependent on the leakage currents in the transistors of the translator, or on a contradiction between two logic signals.

There may then be unnecessary consumption in the interface circuit, related to an untimely operation of a part of the interface circuits. It would be desirable to detect these situations in order to force the output signals of the translators, and therefore the internal control signals and the output signals of the interface circuits, into a defined state. In particular, the most reliable state for the output signals in a core power-off situation is the high impedance state.

A voltage detection device meeting these requirements must furthermore be adapted to various external constraints. The interface supply voltage may indeed have a different level depending on the application. For example, it may be 2.3 volts to 3.6 volts for interfaces covering typical supply voltages of 2.5 volts and 3.5 volts.

The detector must work properly throughout this range of voltage. Furthermore, it should not consume power in the stable states. A classic detector typically comprises an inverter stage controlled by the core supply voltage and powered by the interface supply voltage by a diode or series of diodes.

If, in a given application, the interface supply voltage is within the lower limit, 2.3 volts in the example, there will not be enough voltage to properly power the inverter stage because of the drop in voltage in the diodes. If, in a given application, the interface supply voltage is within the higher limit, 2.6 volts in the example, there will be, on the contrary, excessive voltage so that the inverter will consume power all the time.

SUMMARY OF THE INVENTION

In view of the foregoing background, an object of the present invention is to provide a voltage detector that detects unnecessary consumption in the interface circuit while meeting the above described constraints.

The invention therefore relates to a device for the detection of the level of the core supply voltage of an integrated circuit with respect to the level of an interface power supply voltage at a higher nominal level, applied as a power supply voltage to interface circuits of the integrated circuit. For the transmission of input/output signals, the detection device gives a detection signal applied to the interface circuits to set their output in a state of high impedance and minimize their power consumption when the level of the core supply voltage is far too low to enable operation of the integrated circuit.

According to one aspect of the invention, this voltage detection device comprises an input stage comprising an inverter controlled by the core voltage. The input stage is powered with the interface power supply voltage by a power supply stage comprising a diode or series of diodes and a capacitor.

In one variation, the capacitor is formed by a P-type MOS transistor that is series-connected between the diode or series of diodes and the inverter of the input stage. Its gate is then connected to ground and its substrate electrode or well is connected to the interface supply voltage. Its drain and source may also be connected together.

In another alternative embodiment, the detection device furthermore comprises a buffer type output stage comprising an inverter directly powered by the interface power supply voltage and a pull-down transistor for pulling the output node of the inverter of the input stage, controlled by the signal delivered by the output stage, to the interface power supply voltage.

In another alternative embodiment, the detection device comprises a current loop with gain greater than 1 associated with the input stage, and an output stage is connected between the interface power supply voltage and ground. A first transistor copies the current of the loop, and a second translator that is controlled by the core supply voltage is series-connected with the first transistor. The detection signal is given by the intermediate connection node between the first and second transistors. This output signal of the detection device is applied to the input/output interface circuits of the integrated circuit, powered by the interface supply voltage Vdd3, to set them in a high impedance state and minimize their consumption.

BRIEF DESCRIPTION OF THE DRAWINGS

Other features and advantages of the invention are described in detail in the following description, given by way of an indication that in no way restricts the scope of the invention, with reference to the appended drawings of which.

DETAILED DESCRIPTION OF THE PREFERRED EMBODIMENTS

Figure 1A:
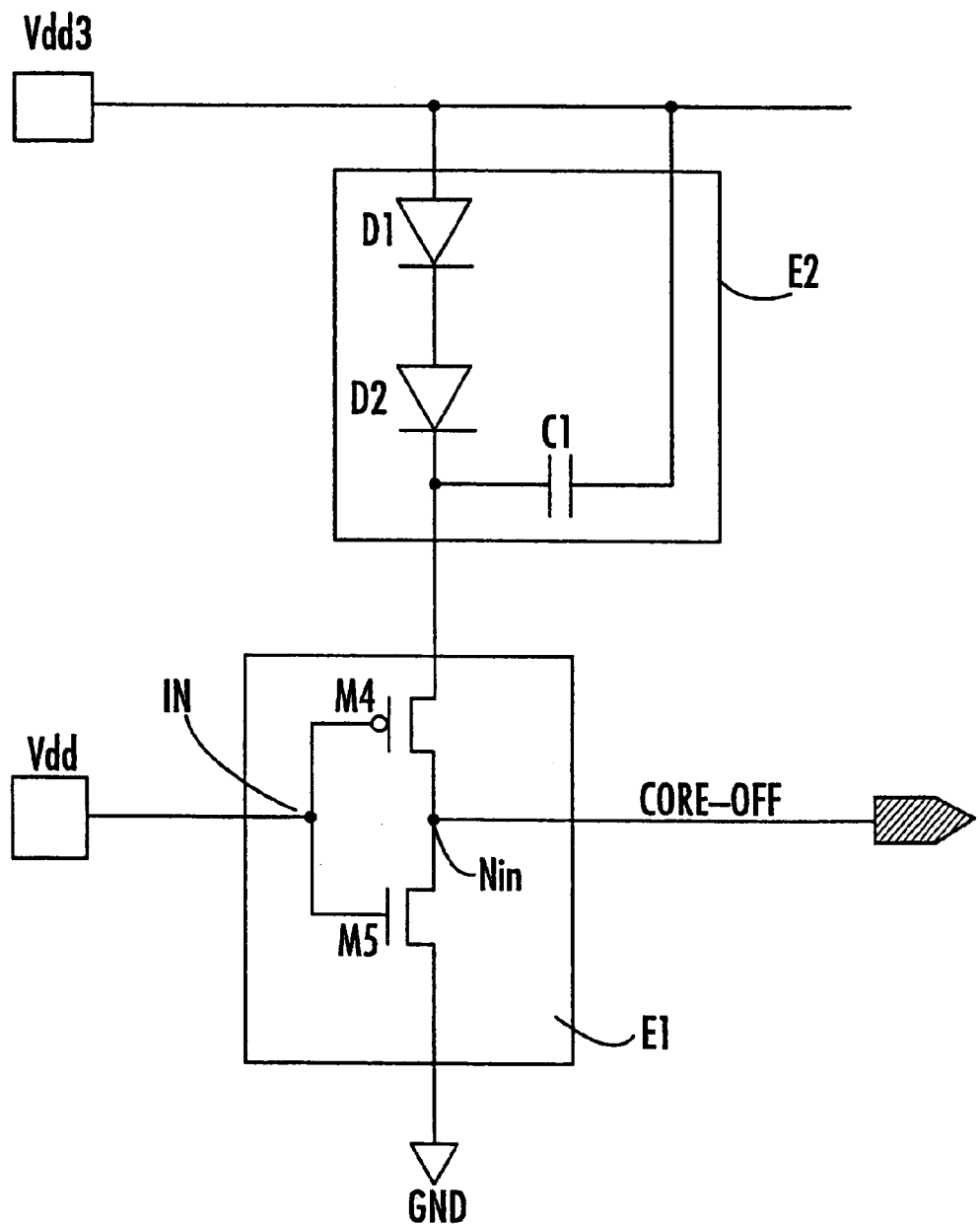
FIGS. 1a and 1b show the basic structure of a power supply detection device according to the present invention.

FIG. 1a shows a power supply detection device 1 according to the invention. This circuit outputs a detection signal CORE-OFF whose active level indicates that a core power-off situation has been detected. It may be recalled that the core power-off situation according to the invention occurs as a result of either of the following two situations. It may occur when the integrated circuit is powered on from a core supply voltage Vdd whose voltage buildup is far slower then that of the interface supply voltage Vdd3. It may also occur during the functional operation of the integrated circuit, through the disappearance of the core supply voltage Vdd, i.e., a drop in the core supply source.

A detection system according to the invention can be used to detect these power-off situations. According to the invention, this device generates a detection signal when the level of the core supply voltage is far too low to enable the operation of the integrated circuit. An exemplary embodiment of a device of this kind according to the invention is shown in FIG. 1a. It comprises an input stage E1 comprising an inverter controlled at input IN by the core supply voltage. The inverter of the input stage is typically a CMOS inverter comprising, in the example, a PMOS transistor M4 and an NMOS transistor MS. This input stage is powered with the interface power supply voltage Vdd3, by a power supply stage E2 comprising a diode or a series of diodes (in the example, two diodes D1 and D2), and the capacitor C1.

Figure 1B:
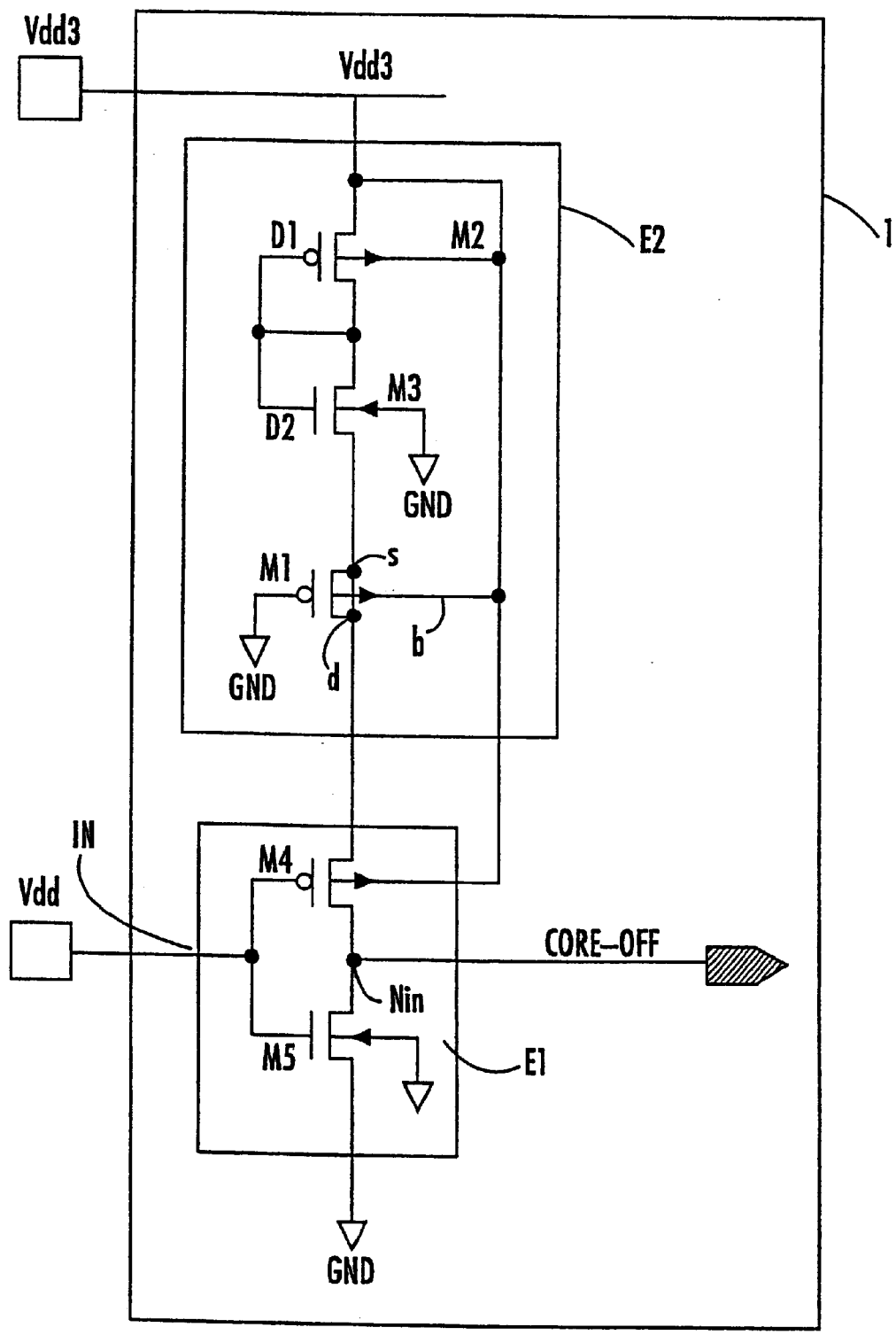

As shown in the FIG. 1b, the diodes may be made out of MOS transistors whose gate and drain are short-circuited. In the example, the first diode D1 is connected to the interface power supply voltage, and is formed by a PMOS transistor M2. The second diode D2 is connected between the first diode and the capacitor C1, and is formed by an NMOS transistor M3. The capacitor C1 (FIG. 1a) has one of its terminals connected to the interface supply voltage Vdd. The other terminal is connected to the connection point between the diode D2 and the input of the inverter E1. The capacitor C1 makes it possible to switch the inverter of the input stage for low interface supply voltages, such as for voltages of 2.3 V, for example.

The transistors M2 and M3, which are diode configured, are sized so that the current that flows through them during normal operation remains low as compared with the power consumption of the rest of the integrated circuit, regardless of the conditions of the temperature and the interface power supply voltage. With a setting of this kind, in the power-off situations and when there is a low power supply voltage, the current that flows across the transistors M2 and M3 is also very low, which is in the range of only a few tens of pico-amperes ($10^{-12}$ amperes). This current is far too low to power the inverter E1 and build up its voltage at output. The capacitor C1 is used to overcome this problem of detection at low interface supply voltages.

During normal operation, the low current that flows across the transistors M2 and M3 is stored in the form of electrical charges in the capacitor. If the core supply voltage drops, the transistor M4 becomes conductive, and the capacitor C1 is discharged through this transistor M4 towards the output of the inverter E1, and causes the voltage to build up at the output of the inverter.

In the other power-off situation, when the interface power supply voltage increases faster than the core power supply voltage, the capacitor C1 creates a capacitive coupling between the interface power supply voltage and the source of the transistor M4. This enables the transistor M4 to be placed in a conductive state and enables the transmission of the charges through this transistor M4 to the output of the inverter.

FIG. 1b shows a preferred embodiment of the capacitor C1. In this embodiment, the capacitor C1 is formed by a P-type MOS transistor M1, whose gate is grounded. The drain and source of this transistor are connected to each other at the connection point between the diode D2 (or a series of diodes D1, D2) and the inverter of the input stage E1.

The substrate or well electrode of this transistor M1 is connected to the interface supply voltage Vdd3. One variation (not shown) may be obtained by removing the drain-source link of the transistor M1. Since the gate of this transistor is biased to ground, the drain and source electrodes are already connected to each other by the transistor itself, since it is conductive. In this case, the source of the transistor M1 is connected to the diode D2 (or a series of diodes) and the drain of the transistor M1 is connected to the transistor M4 of the inverter of the input stage E1.

In a capacitor C1 formed by a transistor M1 of this kind, it is the parasitic source-substrate and drain-substrate capacitors that are used. This embodiment using a transistor-capacitor M1 is advantageous because it makes use of the inverse source-substrate diode current and drain-substrate diode current of this transistor which are added to the current that flows across the series of diodes D1, D2 (M2, M3), thus favoring the charging of this transistor-capacitor M1.

The capacitor C1 may be made with an N-type MOS transistor configured as a classic capacitor, whose gate would be connected to the interface power supply voltage Vdd3 and whose substrate electrode or well, drain and source would be connected together to the connection point between the diode D2 and the inverter of the input stage E1. However, in this case, no benefit will be derived from the inverse diode currents. A detection device of this kind can therefore be used for the efficient detection of the power-off situations in which the logic signals of the core of the integrated circuit no longer have any meaning.

Figure 2:
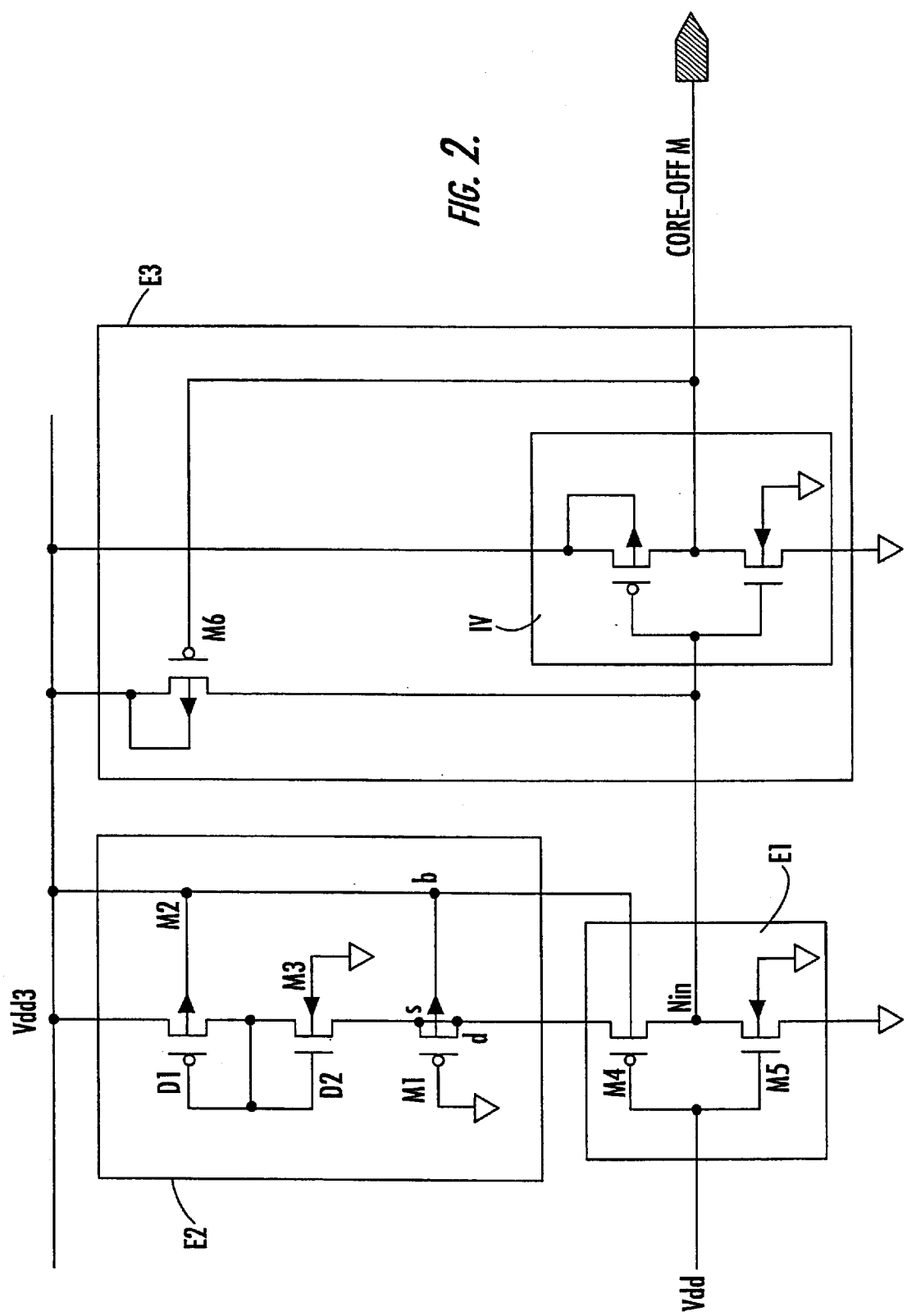
FIG. 2 shows a first alternative embodiment of the detection device according to the present invention.

FIG. 2 shows an alternative embodiment of a detection device according to the invention. With the detection device shown in FIG. 1a, a detection signal CORE-OFF is obtained at output Nin of the inverter. The two levels of this signal corresponding to the logic states 0 and 1 are 0 and Vdd3-2Vtm, where Vt represents a threshold voltage of the MOS transistor.

This detection circuit is to be applied to interface circuits powered by the interface supply voltage Vdd3. In particular, if it is sought to turn off a P-type MOS transistor in a reliable way, the full level of the supply voltage Vdd3 must be applied to its gate. The voltage level corresponding to the logic state 1 given by the detection device described with reference to FIG. 1a does not meet this condition.

The detection device shown in FIG. 2 thus comprises an output stage E3 following the input stage E1, to obtain the desired output levels for the inverse detection signal $C_{ORE\text{-}OFFn}$. This output stage E3 comprises an inverter IV directly powered by the interface supply voltage Vdd3, and a pull-down transistor M6 for pulling the output node Nin of the inverter of the input stage to the interface power supply voltage Vdd3. This pull-down transistor M6 is typically a P-type MOS transistor, controlled at its gate by the inverse detection signal $C_{ORE\text{-}OFFn}$ given by the inverter IV of the output stage E3. This positive pull-down transistor M6 enables the proper stabilizing of the detection device. It maintains the node Nin at Vdd3, by feedback.

With the output stage E3, a hysteresis detection is obtained with a low threshold of switching from a state of the presence of a core power supply to a state of the absence of a core power supply, and a high threshold of switching of the detection circuit from a state of absence of the core supply to a state of presence of the core supply. In particular, if the output node Nin of the input stage is at Vdd3, then the signal IN applied to its input rises sufficiently to force the output node Nin downwards, and consequently, cut off the pull-down transistor M6. In a practical example, for integrated circuits using 0.18 μ technology with a core supply voltage of 1.8 volts, the high threshold may thus be equal to 0.98 volts and the low threshold may be equal to 0.33 volts.

Figure 3:
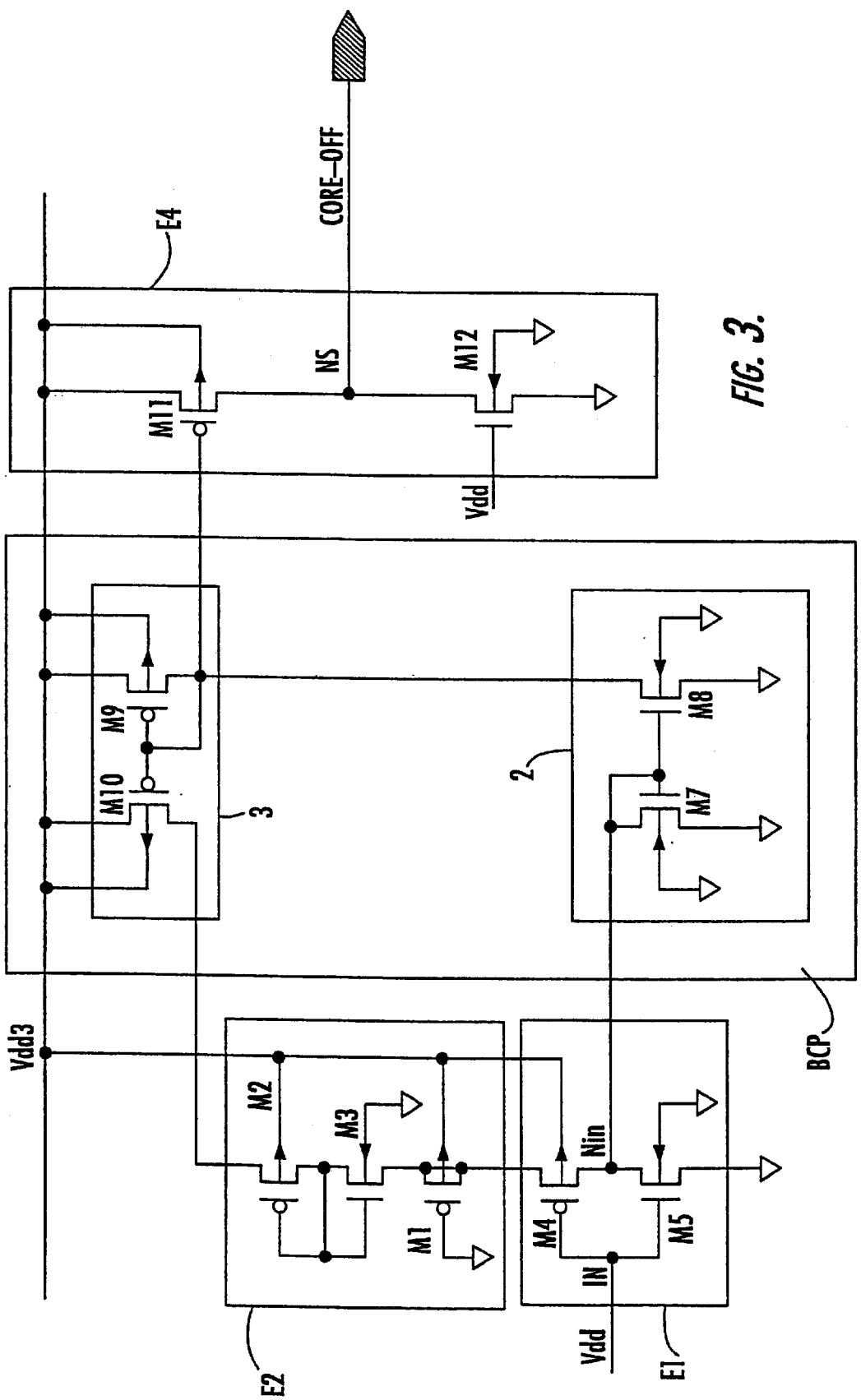
FIG. 3 shows a second alternative embodiment of the detection device according to the present invention.

FIG. 3 shows another alternative embodiment of a detection device according to the invention. This variation can be used to give not only the desired voltage level at the output, namely 0 and Vdd3, but also a satisfactory operation of the detection device, while the difference between the minimum and maximum interface supply voltages is greater than the nominal level of the core supply voltage Vdd itself.

This is what happens especially with integrated circuits using 0.12 μ technology, with a core supply voltage that can drop to 0.9 volts, in applications requiring a wide range of operation with respect to the interface power supply voltage, such as 2.3 volts to 3.6 volts, for example. In this case, the detection of the power-off situation cannot rely on a detection of an increase in the difference between the core supply voltage and the interface supply voltage, since this voltage difference may be greater in certain cases of normal operation than in power-off situations.

In this alternative embodiment, the detection circuit comprises, in addition to the input stage E1 and its power supply stage E2, a current loop BCP with gain greater than 1 associated with the input stage. An output stage E4 comprising a transistor M11 for copying the current in the loop is connected to the interface supply voltage, and a transistor M12 is directly controlled by the core supply voltage, and is connected to ground.

In the exemplary embodiment shown in FIG. 3, the current loop associated with the input stage comprises two current mirror structures 2 and 3. The first current mirror structure comprises a MOS transistor M7 configured as a diode (with the gate and drain connected), and is connected between the output node Nin of the input stage E1 and ground. A second MOS transistor M8, has its gate connected to the gate of the transistor M7, namely therefore to the node Nin.

The second current mirror structure 3 comprises a first MOS transistor M9 configured as a diode (with gate and drain connected), and a second MOS transistor M10 connected between the interface power supply voltage Vdd3 and the power supply stage E2. The transistor M9 is series connected with the transistor M8, between the interface power supply voltage Vdd3 and ground. The transistor M9 has its gate connected to the gate of the second transistor M10. The sizes of the transistors of the structures 2 and 3 of the loop are determined so that they have a gain greater than 1. They are determined by the usual methods.

The output stage E4 comprises the transistors M11 and M12 series connected between the interface power supply voltage Vdd3 and ground. The first MOS transistor M11 is connected between the interface power supply voltage Vdd3 and the output node Ns which gives the detection signal $C_{ORE\text{-}OFF}$. It has its gate controlled by the gate of the transistor M9 with which it forms a current mirror. Thus, the current of the loop is copied by the transistor M11. The second MOS transistor M12 is connected between the node Ns and ground. It has its gate controlled by the core power supply voltage Vdd.

With a detection device of this kind, if the core power supply voltage is at its nominal value, 1.2 volts in the example, the transistor MS of the input stage E1 is on and the output node Nin is pulled to ground. No current flows in the loop BCP. Furthermore, the transistor M12 of the output stage E4 is conductive and pulls the node Ns of the stage to ground. The current in the stages E1 and E2 is then cut off by the transistor M10.

If the core power supply voltage Vdd drops to zero, the transistors MS and M12 are off. The current loop is active and the transistor M11 of the output stage E4 copies the loop current. The node NS (CORE-OFF) is pulled to the interface power supply voltage Vdd3.

With a detection device of this kind, the detection is effective even for very nominal values of the power supply voltage that are very low when compared with the interface power supply voltage. Furthermore, when the power supply voltages are at their nominal values, this device does not show any consumption (current loop off), and this is advantageous.

Figure 4:
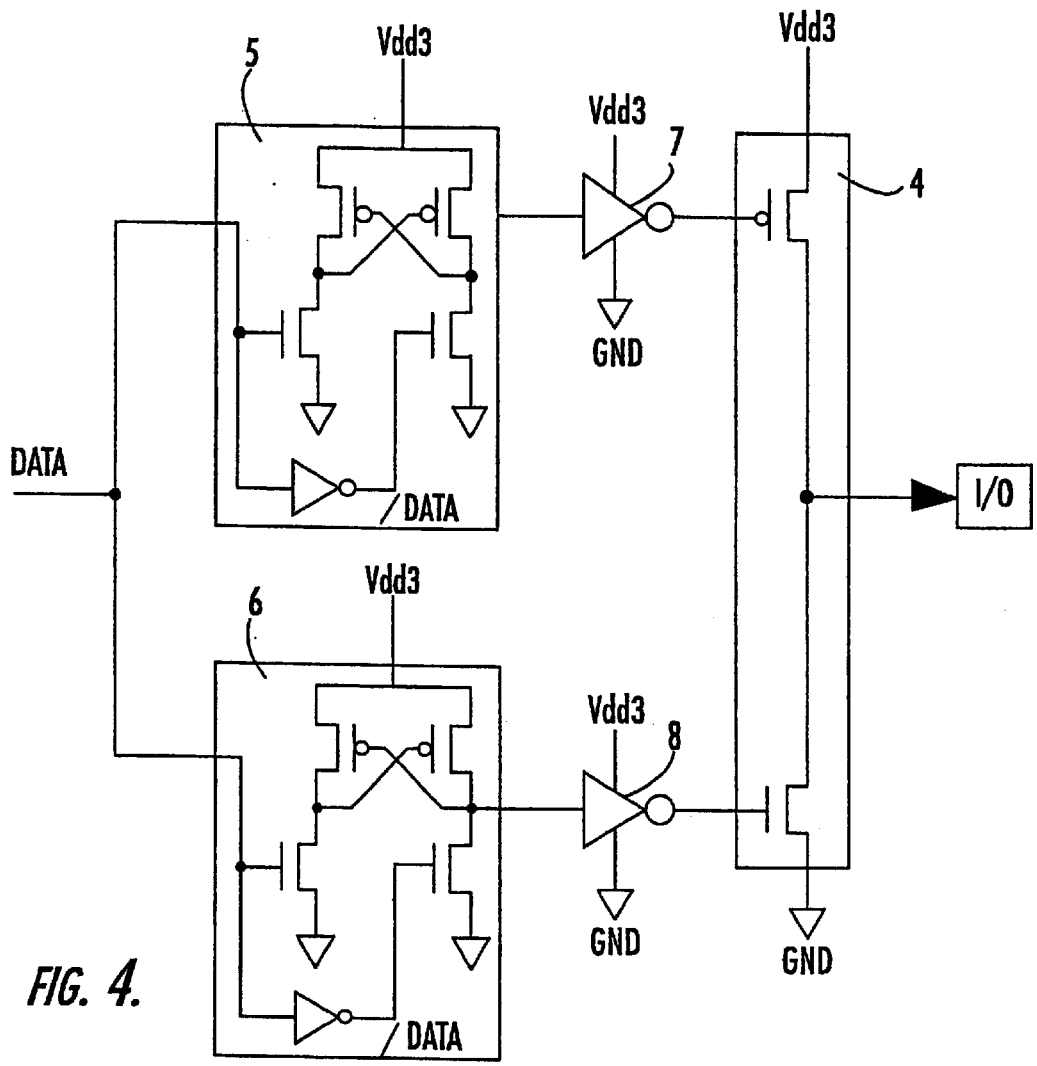
FIG. 4 shows an exemplary embodiment of an input/output interface circuit of an integrated circuit with a core supply voltage and an interface supply voltage according to the present invention.

FIG. 4 shows an exemplary interface circuit for the transmission of data at output, to which it is possible to apply a detection signal according to the invention. This interface circuit comprises a buffer type output stage 4. An output stage of this kind is generally a stage with N-type and P-type transistors. It is connected between the interface power supply voltage Vdd3 and ground. This output stage is to be controlled by level signals defined with respect to this interface voltage.

Thus, a level translator, referenced 5 and 6 in the figure, provides the control signal for each of the transistors of the output stage, from a logic signal DATA, namely data to be transmitted, coming from the core of the integrated circuit. Each translator (references 5 and 6) is usually followed by an inverter (references 7 and 8) powered by the interface power supply voltage Vdd3, so as to preserve the same polarity.

In an interface circuit of this kind it is important to prevent the transmission of the logic signal DATA at the output in power-off situations of the core supply voltage Vdd as defined in the invention. It is therefore necessary to set the output of the interface circuit, namely the output of the buffer, in a high impedance state.

It is also necessary to prevent unnecessary consumption in translators crossed by internal control signals of the interface circuit. For this purpose, in power-off situations defined in the invention, it is enough to set the output of the translators of the interface circuit in an appropriate state. Setting the output of the translators in a determined logic state that is independent of the signal to be transmitted, and such that the two transistors of the buffer are set in the off state provides an answer to the different problems of control of the interface circuits.

Figure 5:
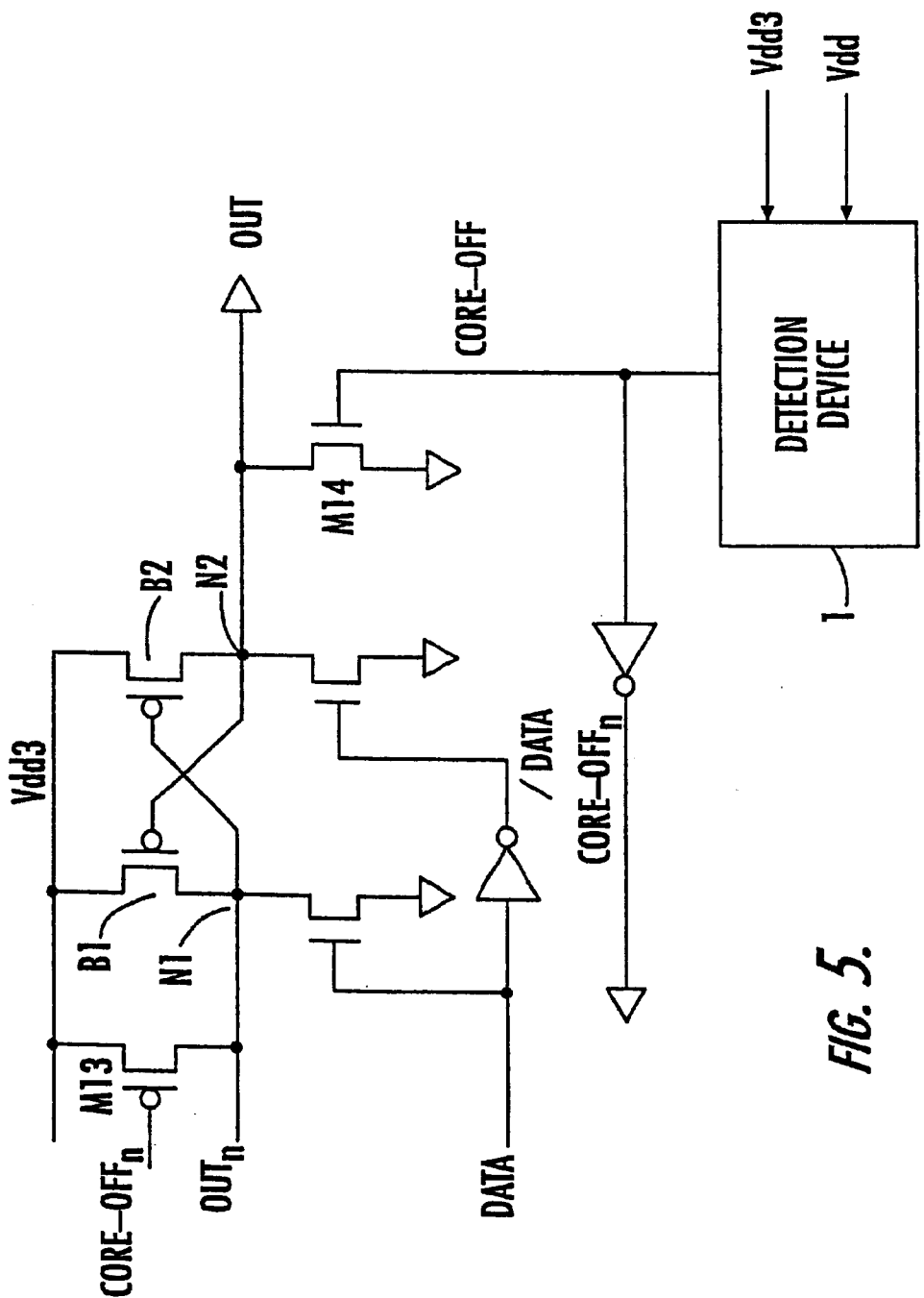
FIG. 5 shows an exemplary application of a detection signal to an interface circuit according to the present invention.

FIG. 5 shows a level translator in which there are provided means controlled by a detection device 1 according to the invention. These means are used, in a power-off situation, to set its output in a determined state, independent of the logic signal DATA applied at input. Thus, in addition to the usual two-arm structure B1 and B2 of the translator, an additional transistor is provided on each arm.

A first transistor M13 is connected between the interface power supply voltage Vdd3 and an output node N1 of an arm B1, and a second transistor M14 is connected between the output node of the other arm B2 and ground. In the example, the transistor M13 is a P-type MOS transistor and the transistor M14 is an N-type MOS transistor. Of these two transistors, the first one is controlled by the inverse detection signal $C_{ORE-OFFn}$ and the second one is controlled by the detection signal $C_{ORE-OFF}$.

When the detection signal CORE-OFF goes to the active state, Vdd3 in the example, the transistor M13 sets the output node N1 of the associated arm at Vdd3 while the transistor M14 pulls the output node N2 of the other arm to zero. If it is sought to pull the nodes N1 and N2 to 0 and Vdd3 respectively, it will be enough to reverse the roles of the transistors M13 and M14.

Figure 6:
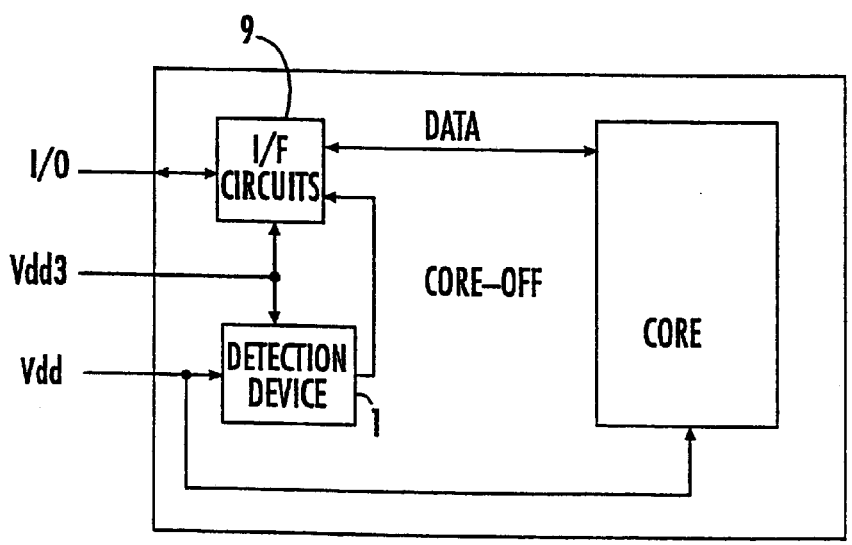
FIG. 6 gives a schematic view of an integrated circuit comprising a detection device according to the present invention to set, if necessary, the circuits in a state of high impedance and minimize their power consumption.

With a detection device according to the invention, it is thus possible to control the interface circuit in a sure way so that operation of the integrated circuits in their applications environment is made more dependable. FIG. 6 gives a schematic view of an integrated circuit comprising a detection device 1 according to the invention. This detection device gives a detection signal CORE-OFF applied to the interface circuits 9 powered by the interface power supply voltage Vdd3 to set them, in the power-off situation, in a state of high impedance.

That which is claimed is:

1. A detection device for an integrated circuit comprising a core and interface circuits connected to the core for providing output signals therefrom, the detection device for detecting a level of a core supply voltage applied to the core with respect to a level of an interface supply voltage applied to the interface circuits, with the interface supply voltage being higher than the core supply voltage, the detection device comprising:
    an input stage connected to the core supply voltage and to the interface supply voltage for providing a detection signal to the interface circuits for setting outputs thereof to a high impedance state when a level of the core supply voltage is too low to enable operation of the core, said input stage comprising an inverter controlled by the core supply voltage; and
    a power supply stage comprising at least one diode and a capacitor connected thereto, said power supply stage being connected between the interface supply voltage and said input stage for providing the interface supply voltage thereto.

2. A detection device according to claim 1, wherein power consumption of the interface circuits is minimized when the outputs thereof are in a high impedance state.

3. A detection device according to claim 1, wherein the detection signal corresponds to the core supply voltage being powered off.

4. A detection device according to claim 1, wherein said at least one diode comprises a plurality of diodes connected together in series between the interface supply voltage and said input stage; and wherein said capacitor has a first electrode connected to said input stage and a second electrode connected to the interface supply voltage.

5. A detection device according to claim 1, wherein said capacitor comprises a P-type MOS transistor series-connected between said at least one diode and said inverter of said input stage, said P-type MOS transistor comprising a gate connected to a voltage reference and a substrate connected to the interface supply voltage.

6. A detection device according to claim 5, wherein the voltage reference comprises ground.

7. A detection device according to claim 5, wherein said P-type MOS transistor comprises a drain and source connected together.

8. A detection device according to claim 1, further comprising an output stage connected to said input stage and to the interface supply voltage, said output stage comprising:
    a second inverter controlled by the detection signal from said input stage, said second inverter being powered by the interface supply voltage; and
    a pull-down transistor connected between the interface supply voltage and an output of said input stage, said pull-down transistor being controlled by an output signal provided by said second inverter.

9. A detection device according to claim 1, further comprising:
    a current loop having positive gain connected to said input stage; and
    an output stage connected to said current loop and comprising
        a first transistor for coping a current of said current loop,
        a second transistor connected to said first transistor via an intermediate connection node and being controlled by the core supply voltage, and
        said first and second transistors being series-connected between the interface supply voltage and a voltage reference, with the detection signal being provided from the intermediate connection node.

10. An integrated circuit comprising
    a core connected to a core supply voltage;
    at least one input/output interface circuit connected to said core, and to an interface supply voltage that is greater than the core supply voltage, said at least one input/output interface circuit comprising
        at least one level translator connected to the interface supply voltage for changing a level of a logic signal provided by said core; and
        a translator output stage connected to said at least one level translator; and
    a detection device connected to the core supply voltage and to the interface supply voltage for detecting a level of the core supply voltage with respect to a level of the interface supply voltage, said detection device for providing a detection signal to said at least one input/output interface circuit for setting outputs thereof in a high impedance state when the level of the core supply voltage is too low to enable operation of said core.

11. An integrated circuit according to claim 10, wherein said at least one level translator receives a control signal from said detection device for setting an output of said at least one level translator to a state determined independently of the level of the logic signal provided by said core.

12. An integrated circuit according to claim 10, wherein said translator output stage is set to a high impedance state corresponding to the core supply voltage being powered off.

13. An integrated circuit according to claim 10, wherein said at least one level translator comprises first and second arms connected between the interface supply voltage and a voltage reference, with each arm having an output node; and further comprising a first transistor connected between the interface supply voltage and the output node of said first arm, and a second transistor connected between the output node of said second arm and the voltage reference for setting each output node to a determined state.

14. An integrated circuit according to claim 10, wherein said detection device comprises:
    an input stage connected to the core supply voltage and to the interface supply voltage for providing the detection signal, said input stage comprising an inverter controlled by the core supply voltage; and
    a power supply stage comprising at least one diode and a capacitor connected thereto, said power supply stage is connected between the interface supply voltage and said input stage for providing the interface supply voltage thereto.

15. An integrated circuit according to claim 14, wherein said at least one diode comprises a plurality of diodes connected together in series between the interface supply voltage and said input stage; and wherein said capacitor has a first electrode connected to said input stage and a second electrode connected to the interface supply voltage.

16. An integrated circuit according to claim 14, further comprising an output stage connected to said input stage and to the interface supply voltage, said output stage comprising:
    a second inverter controlled by the detection signal from said input stage; and being powered by the interface supply voltage; and
    a pull-down transistor connected between the interface supply voltage and an output of said input stage, and being controlled by an output signal provided by said second inverter.

17. An integrated circuit according to claim 14, further comprising:
    a current loop having positive gain is connected to said input stage; and
    an output stage connected to said current loop and comprising
        a first transistor for coping a current of said current loop,
        a second transistor connected to said first transistor via an intermediate connection node and being controlled by the core supply voltage, and
        said first and second transistors being series-connected between the interface supply voltage and a voltage reference, with the detection signal being provided from the intermediate connection node.

18. A method for operating an integrated circuit core connected to a core supply voltage, the integrated circuit also comprising at least one interface circuit connected to the core and to an interface supply voltage higher than the core supply voltage, the method comprising:
    detecting a level of the core supply voltage;
    setting an output of the at least one interface circuit to a high impedance state when the level of the core supply voltage is too low to enable operation of the core;
    the detecting and setting being performed using a detection circuit connected to the core and to the interface supply voltage, the detection circuit for providing a detection signal to the at least one interface circuit for setting the output of the at least one interface circuit to the high impedance state, the detection circuit comprising an input stage connected to the core supply voltage and to the interface supply voltage for providing the detection signal, the input stage comprising an inverter controlled by the core supply voltage, and a power supply stage comprising at least one diode and a capacitor connected thereto, the power supply stage being connected between the interface supply voltage and the input stage for providing the interface supply voltage thereto.

19. A method according to claim 18, further comprising an output stage connected to the input stage and to the interface supply voltage, the output stage comprising:
    a second inverter controlled by the detection signal from the input stage, and being powered by the interface supply voltage; and
    a pull-down transistor connected between the interface supply voltage and an output of the input stage, and being controlled by an output signal provided by the second inverter.

20. A method according to claim 18, further comprising:
    a current loop having a positive gain is connected to the input stage; and
    an output stage connected to the current loop and comprising
        a first transistor for coping a current of the current loop,
        a second transistor connected to the first transistor at an intermediate connection node and being controlled by the core supply voltage, and
        the first and second transistors being series-connected between the interface supply voltage and a voltage reference, with the detection signal being provided from the intermediate connection node.

* * * * *